US006184732B1

(12) United States Patent
Johnson et al.

(10) Patent No.: US 6,184,732 B1
(45) Date of Patent: Feb. 6, 2001

(54) SETTING THE COMMON MODE LEVEL OF A DIFFERENTIAL CHARGE PUMP OUTPUT

(75) Inventors: Luke A. Johnson, Tempe, AZ (US); Timothy E. Fiscus, South Burlington, VT (US)

(73) Assignee: Intel Corporation, Santa Clara, CA (US)

( * ) Notice: Under 35 U.S.C. 154(b), the term of this patent shall be extended for 0 days.

(21) Appl. No.: 09/370,622

(22) Filed: Aug. 6, 1999

(51) Int. Cl.[7] .................................................. H03L 7/06
(52) U.S. Cl. .................................... 327/157; 327/536
(58) Field of Search .............................. 327/156, 157, 327/158, 159, 2, 3, 5, 12, 536; 331/1 R, 10, 17, 41, 1 A

(56) References Cited

U.S. PATENT DOCUMENTS

| | | | |
|---|---|---|---|
| 5,592,120 | * 1/1997 | Palmer et al. | 327/536 |
| 5,736,880 | 4/1998 | Bruccoleri et al. | 327/157 |
| 5,781,048 | * 7/1998 | Nakao et al. | 327/157 |
| 5,831,484 | 11/1998 | Lukes et al. | 327/157 |
| 5,936,455 | * 8/1999 | Babanezhad et al. | 327/157 |

\* cited by examiner

Primary Examiner—Kenneth B. Wells
Assistant Examiner—Paul Dinh
(74) Attorney, Agent, or Firm—Blakely, Sokoloff, Taylor & Zafman LLP

(57) ABSTRACT

An embodiment of the invention is directed to a circuit including first and second filter nodes for being connected to a filter and first and second bypass nodes corresponding to the first and second filter nodes, respectively. A charge transfer circuit having at least one charge transfer node is to be alternatively coupled to one of the filter nodes and a corresponding one of the bypass nodes for transferring charge to control a differential voltage of the filter nodes. First and second amplifiers are to buffer the voltages on the first and second filter nodes at first and second outputs which are coupled to the first and second bypass nodes, respectively. The output voltage of each amplifier can be adjusted according to a difference between a control voltage and a common mode voltage of the first and second nodes.

26 Claims, 6 Drawing Sheets

SETTING THE COMMON MODE LEVEL OF A DIFFERENTIAL CHARGE PUMP OUTPUT

FIELD OF THE INVENTION

This invention is generally related to analog electronics and more particularly to differential charge pumps commonly used as part of frequency control circuitry such as a phase locked loop.

BACKGROUND

The differential charge pump is a basic building block of many types of analog circuits, including frequency control circuits such as phase locked loops (PLLs). The PLL accurately controls the frequency and phase of an output oscillatory signal so as to match that of an input oscillatory signal. In this way, the output signal precisely tracks, and essentially duplicates, the input signal. The oscillatory signals may be either digital or analog. FIG. 4 shows a block diagram of a conventional PLL. The main process in the loop is a charge pump and integrator/filter combination 408 and a voltage controlled oscillator (VCO) 412. A phase-frequency detector (PFD) 404 provides a differential voltage that is proportional to the phase error. The charge pump and filter 408 condition this error signal to stabilize the PLL loop before sending it to the VCO. The VCO 412 generates an output oscillatory signal whose frequency and phase are proportional to an input differential voltage. An out_phase signal from the VCO 412 is fed back to the PFD 404 and subtracted from an in_phase signal to yield the phase error. Assuming that the control loop can be properly initialized, out_phase should precisely track in_phase in the steady state.

FIG. 5 illustrates the PFD 404 that detects the phase error between two digital signals in_phase and out_phase. The flip-flops and NAND gate in the PFD 404 are configured so that up_sig is asserted high if a rising edge of in_phase leads the corresponding rising edge of the out_phase. On the other hand, if the rising edge of in_phase lags the corresponding rising edge of out_phase, then dn_sig is asserted high. Asserting up_sig indicates that the phase of the oscillatory output signal (see FIG. 4 momentarily) should be increased, whereas dn_sig indicates that the phase should be decreased. Note that both up_sig and dn_sig are deasserted when the lagging rising edge has been detected. These control signals represent the phase error which is the desired change to be implemented in the oscillatory output signal.

The control signals up_sig and dn_sig are translated into a relatively slow changing differential voltage by the charge pump and filter combination 408. This differential voltage is then used to control the frequency and phase of the oscillatory output signal through the VCO 412. FIG. 6 depicts the charge pump and filter combination 408 in block diagram form. The charge pump 408 includes four current generators 422 . . . 428. Each one alternatively sources or sinks current from one of a pair of filter and bypass nodes. The current generators are connected to their respective filter/bypass nodes by solid state switches. The switches for current generators 424 and 428 are controlled by up_sig, whereas the switches for current generators 422 and 426 are controlled by dn_sig (see FIG. 5 momentarily). In typical operation, the voltages on the filter and filter nodes are subjected to rapid differential corrections: increases in response to up_sig and decreases in response to dn_sig . A loop filter 432 integrates/filters these rapid changes to yield a slow changing differential voltage which is then supplied to the VCO 412. The bypass and bypass nodes to help maintain the transistors in the current generators continuously in their saturation region of operation while the generators are not connected to their respective filter nodes, thus providing a differential charge pump circuit whose output voltage in actual operation is more consistent with design values despite manufacturing variations.

The charge pump 408 also includes a common mode control circuit 450 for adjusting the common mode voltage of the filter and filter nodes to a desired level that is suitable for the VCO 412. The common mode control circuit 450 includes a set of current generators 462 and 464 that make corrections directly to the filter and filter nodes in response to a difference between desired and actual common mode levels. This approach to controlling the common mode level, however, has the serious drawback of introducing a low impedance path to a power supply node, i.e., ground, through the current generators 462 and 464, which in turn introduces noise to the filter and filter nodes and may cause the differential output voltage of the charge pump to drift through charge loss.

SUMMARY

An embodiment of the invention is directed to a circuit including first and second filter nodes for being coupled to a filter and first and second bypass nodes corresponding to the first and second filter nodes, respectively. A charge transfer circuit having at least one charge transfer node is to be alternatively coupled to one of the filter nodes and a corresponding one of the bypass nodes for transferring charge to control a differential voltage of the filter nodes. First and second amplifiers are to buffer the voltages on the first and second filter nodes at first and second outputs which are coupled to the first and second bypass nodes, respectively. The output voltage of each amplifier can be adjusted according to a difference between a control voltage and a common mode voltage of the first and second nodes.

Other features and advantages of the invention will be apparent from the accompanying drawings and from the detailed description that follows below.

BRIEF DESCRIPTION OF THE DRAWINGS

The invention is illustrated by way of example and not by way of limitation in the figures of the accompanying drawings in which like references indicate similar elements and in which.

DETAILED DESCRIPTION

According to an embodiment of the invention, a more effective technique is provided for controlling the common mode voltage of the output of a differential charge pump.

Figure 6:
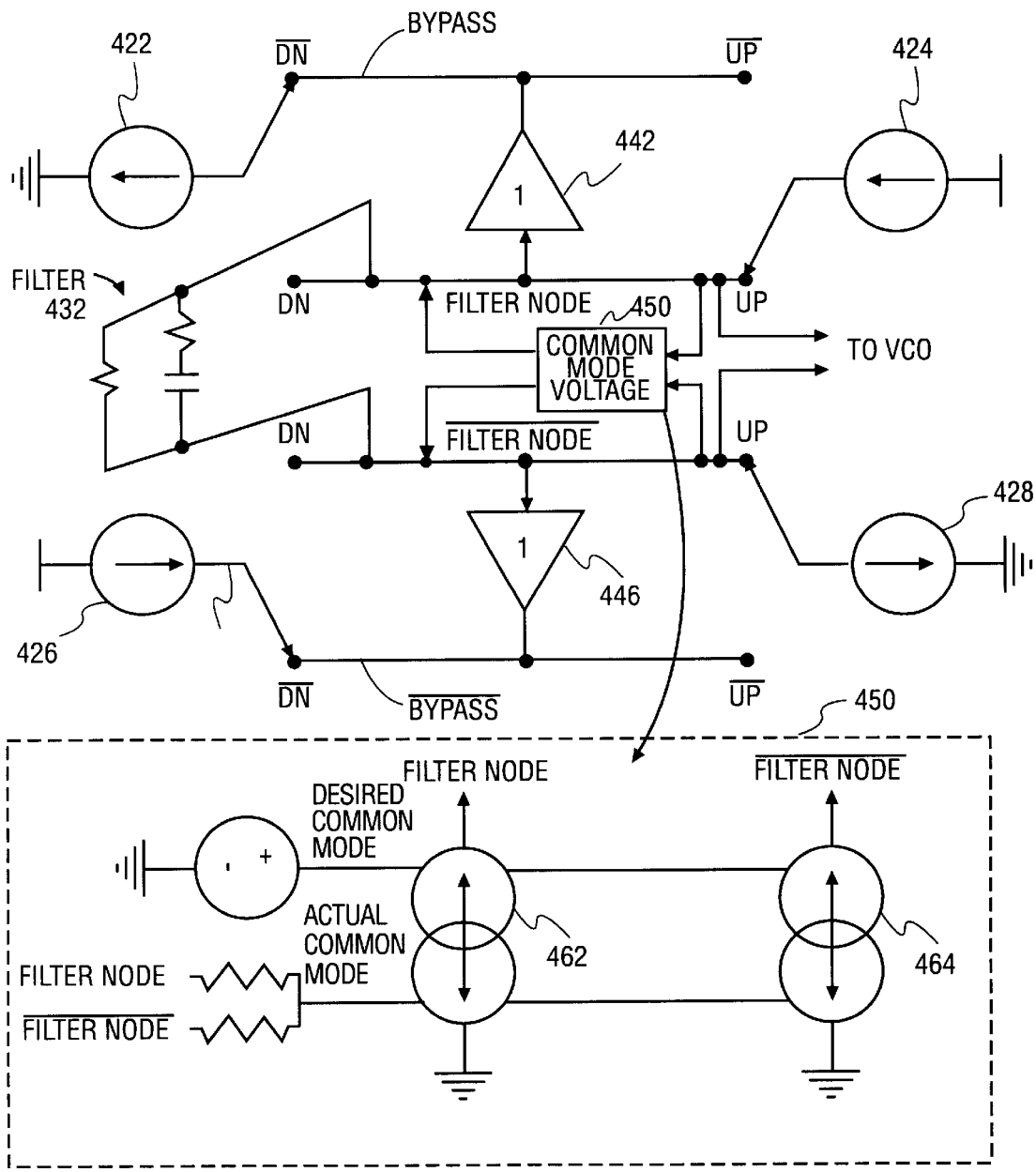
FIG. 6 illustrates a conventional differential charge pump and filter.

The additional loads that were presented to the filter nodes by the outputs of the current generators 462 and 464 in the common mode control circuitry 450 (see FIG. 6) are eliminated, thereby eliminating a leakage path from the filter nodes. The elimination of the leakage path from the filter nodes will help eliminate any static offset in phase error due to charge loss, thus helping maintain a more robust frequency control system.

Figure 1:
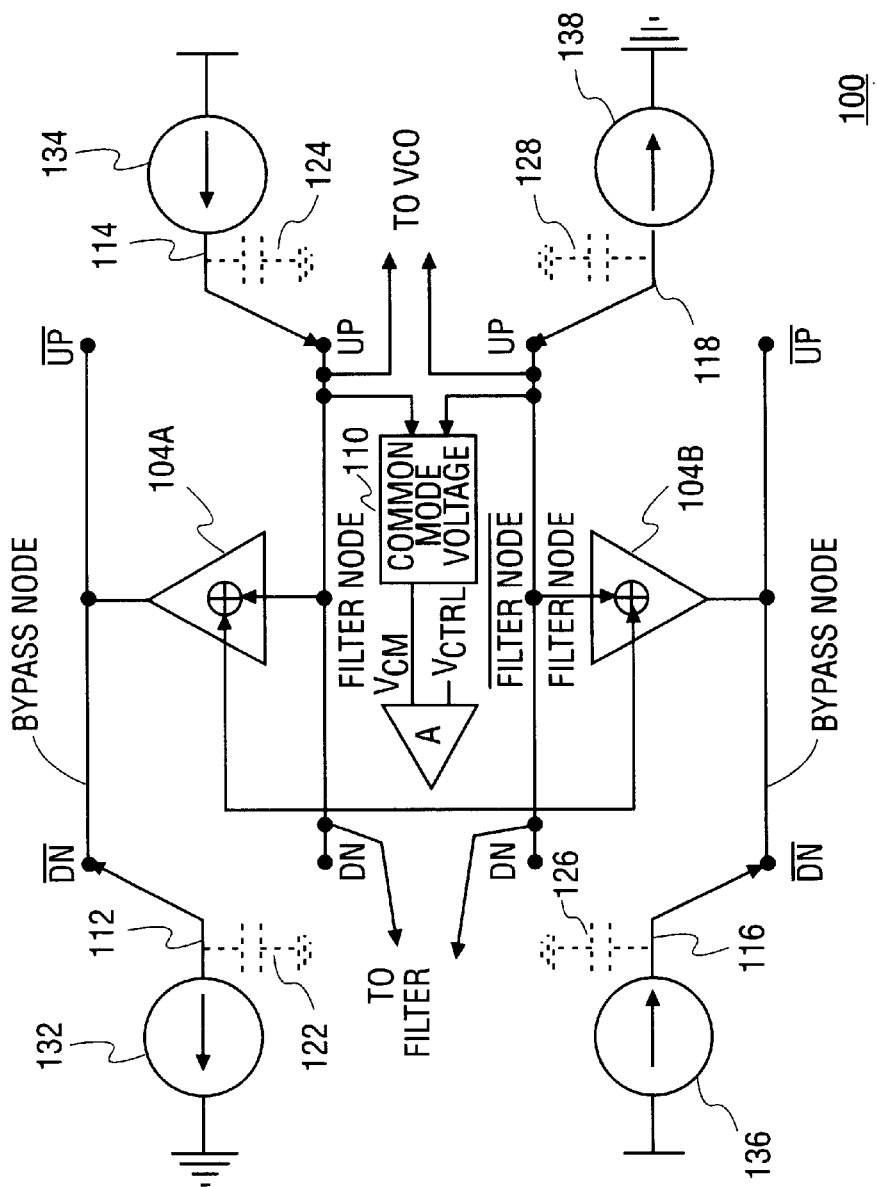
FIG. 1 shows block diagram of differential charge pump according to an embodiment of the invention.

FIG. 1 illustrates an embodiment of the invention as a differential charge pump 100. A pair of complimentary filter nodes (filter node and $\overline{\text{filter node}}$) are provided for being connected to a loop filter and a VCO (not shown). The loop filter may be of a passive variety or of a high input impedance active variety. A pair of bypass nodes (bypass node and $\overline{\text{bypass node}}$) correspond to the filter nodes. An alternative here would be to couple the VCO to the bypass nodes rather than the filter nodes. A charge transfer circuit has at least one charge transfer node, e.g., node 114, that is alternatively coupled to, e.g., switched, between, one of the filter nodes and a corresponding one of the bypass nodes for transferring charge to control a differential voltage of the filter nodes. In the particular embodiment of FIG. 1, there are four such charge transfer nodes: nodes 112, 114, 116, and 118. Nodes 112 and 118 remove charge from their respective filter nodes, whereas nodes 114 and 116 add charge onto the respective filter nodes. Although all four of these nodes may not be absolutely necessary to adequately control the differential voltage on the filter nodes, the use of all four charge transfer nodes provides a particularly high gain charge pump circuit that operates well in high frequency applications.

The voltages on the filter node and the $\overline{\text{filter node}}$ are buffered by amplifiers 104a and 104b, respectively, which are coupled between corresponding filter and bypass nodes. The filter node amplifiers 104a and 104b are replicates of each other, so that the output voltage on the bypass nodes closely tracks any changes in the corresponding voltages on the filter nodes. These amplifiers are in effect trimmable buffers whose output voltage can be adjusted according to a difference between a control voltage $V_{ctrl}$ and a common mode voltage $V_{cm}$ of the filter nodes. The common mode voltage $V_{cm}$ is derived by a common mode voltage block 110 which may be designed according to well-known conventional techniques, including for instance a simple resistor tap or a more elaborate high input impedance active circuit. The common mode voltage at the filter nodes, and thus the common mode voltage on the bypass nodes, is determined by the value of $V_{ctrl}$ in a closed control loop that features the difference amplifier 108. The output of the difference amplifier 108 provides a voltage that is proportional to the difference between $V_{crtl}$ and $V_{cm}$ at all times. This output voltage is then applied to the filter node amplifiers 104a and 104b to trim or adjust the output of the amplifiers. In a particular version of the invention, the output voltage of each amplifier 104 is adjusted by precisely the same amount as the difference between $V_{ctrl}$ and $V_{cm}$. However, there is an alternative here of providing additional gain, either at the difference amplifier 108 or at the filter node amplifier 104. This choice may be made by one of ordinary skill in the art as a function of the desired speed of response in controlling the common mode level. Each filter node amplifier 104 is a unity buffer from filter input to bypass output, but it should be noted that the gain of the trim path need not be unity and can be greater or less than unity as is appropriate for the design specifics.

Common mode control in the differential charge pump 100 is obtained by a charge sharing scheme between the filter and bypass nodes. In the particular embodiment of FIG. 1, the charge sharing occurs in the parasitic capacitances 122, 124, 126, and 128, which appear on their respective charge transfer nodes. The charge on the parasitic capacitance 124 is transferred to the filter node when its charge transfer node 114 is switched from the bypass node to the filter node. This occurs for every one of the parasitic capacitances. The maximum amount of charge that can be transferred is in proportion to (1) a difference between the voltages on the filter node and its corresponding bypass node just before the transfer node is switched to the filter node, and (2) the capacitance of the charge transfer node. This amount of charge may be further increased by providing a separate storage device coupled between the charge transfer node and a power supply node (here, ground) to further increase the charge that is transferred to or from the filter node. Increasing the total capacitance on each charge transfer node may initially yield a faster control loop for controlling the common mode voltage. However, this total capacitance should be balanced against the frequency at which the charge transfer node transitions between the bypass and the filter nodes, to avoid disturbing the design gain of the main process of the frequency control loop (see FIG. 4 momentarily).

The charge transfer circuit includes an up current source 134 and an up current sink 138. The up current source 134 alternatively feeds charge into the filter node and the bypass node, whereas the up current sink 138 alternatively draws charge from the $\overline{\text{filter node}}$ and the $\overline{\text{bypass node}}$. The up current source 134 may include at least one transistor, such as a metal oxide semiconductor field effect transistor (MOSFET), that conducts current from a positive power supply node to the charge transfer node 114. Similarly, the up current sink 138 may have a MOSFET that sinks current into the opposite power supply node, in this case ground. When using conventional phase error control signals (see FIG. 5 momentarily) to control the current path between the charge transfer nodes 114 and 118 and their respective filter and bypass nodes, the up current source/up current sink pair together cause the differential voltage of the filter nodes to increase while the current source and sinks are connected to their respective filter nodes.

The charge transfer circuit may further include a down current sink 132 and a down current source 136, where the down current sink 132 draws from the charge transfer node 112, and the down current source 136 feeds the charge transfer node 116. When these respective charge transfer nodes 112 and 116 are connected to their respective filter nodes, the differential voltage of the filter nodes is decreased.

The charge transfer nodes are alternatively connected to the filter and bypass nodes using solid state switches. In FIG. 1, the switches for charge transfer nodes 114 and 118 are controlled by up_sig while the switches for charge transfer nodes 112 and 116 are controlled by dn_sig. When up_sig is asserted, the switches take the position shown in FIG. 1 indicated by UP, and when deasserted the switches change to the position indicated by $\overline{\text{UP}}$. Similarly, when dn_sig is asserted, the switches for charge transfer nodes 112 and 116 move to the position indicated as DN, whereas when dn_sig is deasserted, the switches move to the position indicated by $\overline{\text{DN}}$.

Figure 2:
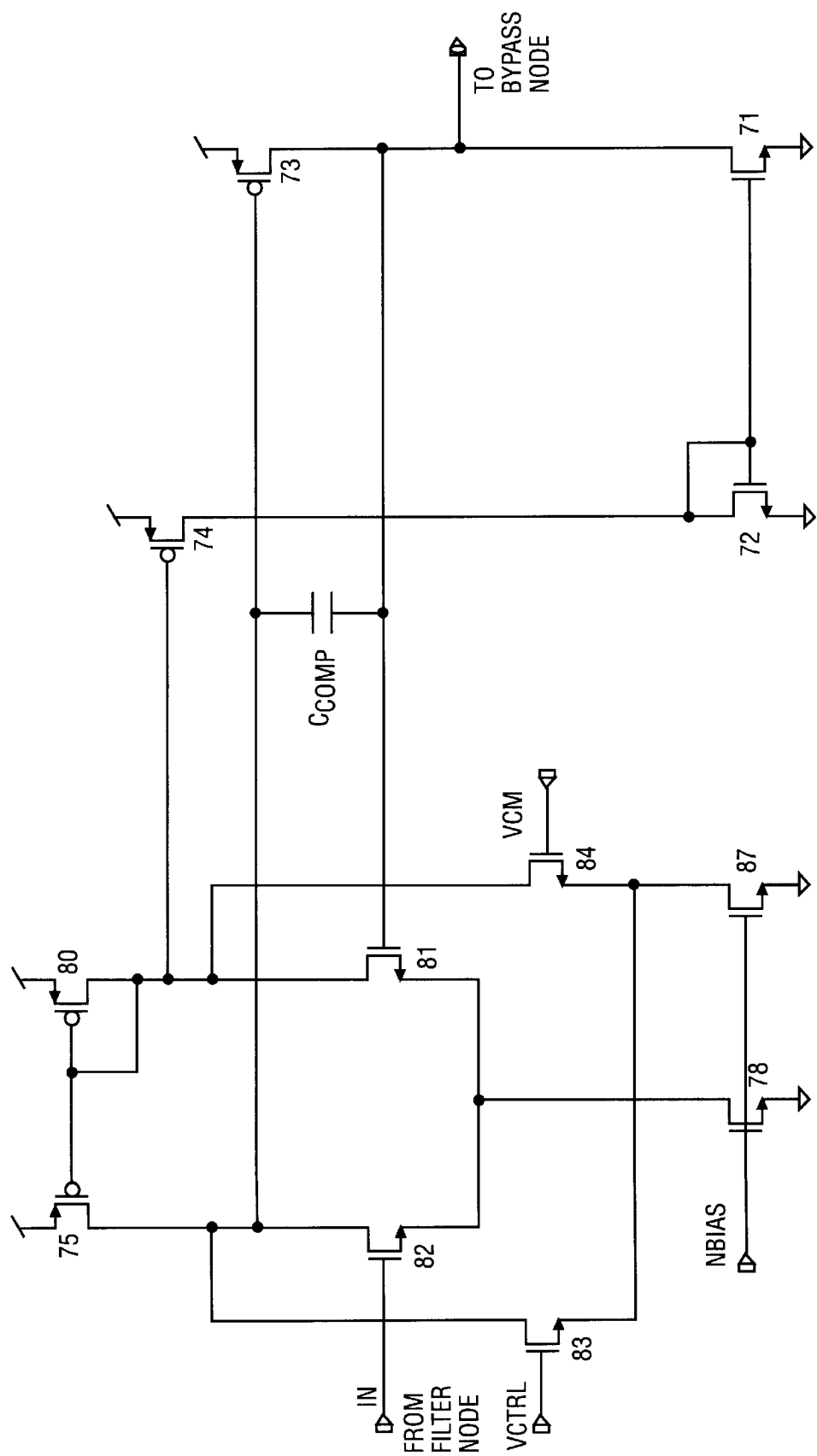
FIG. 2 depicts a circuit schematic of a common mode control circuit for a differential charge pump, according to an embodiment of the invention.

FIG. 2 illustrates a circuit schematic of a common mode control circuit for a differential charge pump according to another embodiment of the invention. The circuit in FIG. 2 is in effect a trimmable buffer that can replace the filter node amplifier 104 (see FIG. 1 momentarily). A two-stage amplifier comprising MOSFETS 82, 81, 75, 80, 74, 73, 71, and 72 is used to buffer the voltage on one of the filter nodes through a node OUT that is connected to the corresponding one of the bypass nodes. An output of the first stage at node N2 is fed back to the opposite input via a compensation capacitor $C_{comp}$. The same output is further amplified and inverted by the second stage that includes p-channel MOSFET 74, diode connected n-channel MOSFET 72, and the p-channel/n-channel pair 73 and 71. A second differential amplifier comprising MOSFETS 83 and 84 shares the load of the two-stage amplifier by virtue of having the drains of the MOSFET differential pair 83–84 connected to the drains of the differential pair 82–81. The shared load in this embodiment includes a diode connected p-channel MOSFET I80 in a current mirror configuration with p-channel MOSFET I75. Each of the differential pairs has a separate bias transistor 78 and 87 which are controlled by the same input bias signal Nbias.

The inputs of the 83–84 differential pair are $V_{ctrl}$ and $V_{cm}$ which are the desired and actual common mode voltages, respectively, of the output of the differential charge pump circuit 100 (see FIG. 1 momentarily). Since the outputs of the 83–84 differential pair are connected to the outputs of the I82–I81 differential pair, any difference between $V_{ctrl}$ and $V_{cm}$ will result in a proportional change in the voltage at the nodes N1 and N2. This change in the voltage between N1 and N2 will in turn be reflected on the bypass node via the second stage of the two-stage amplifier.

When using the embodiment of FIG. 2 as a trimmable buffer between corresponding filter and bypass nodes of the differential charge pump circuit 100, the single difference amplifier 108 (see FIG. 1 momentarily) can be duplicated as two identical differential amplifiers each comprising the differential pair 83–84 as part of a separate trimmable buffer. As was mentioned with respect to the filter node amplifier 104 of FIG. 1, the trimming action of the trimmable buffer in FIG. 2 can be configured to have non-unity gain if desired.

Figure 4:
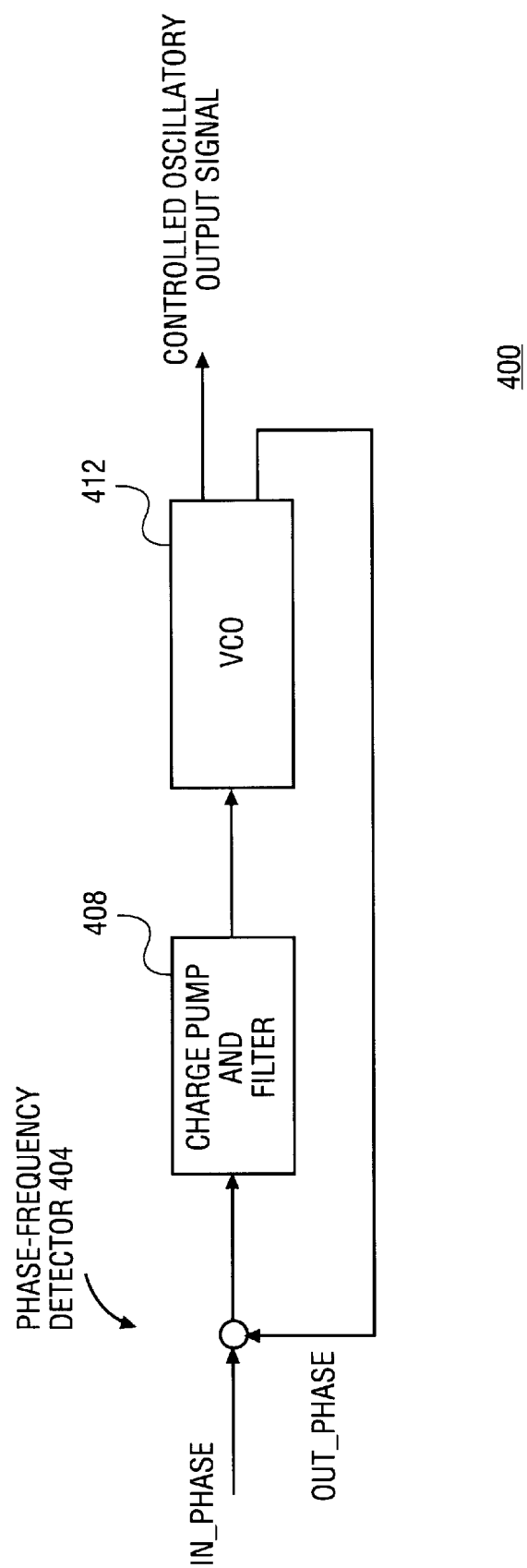
FIG. 4 shows a conventional phase locked loop.
Figure 5:
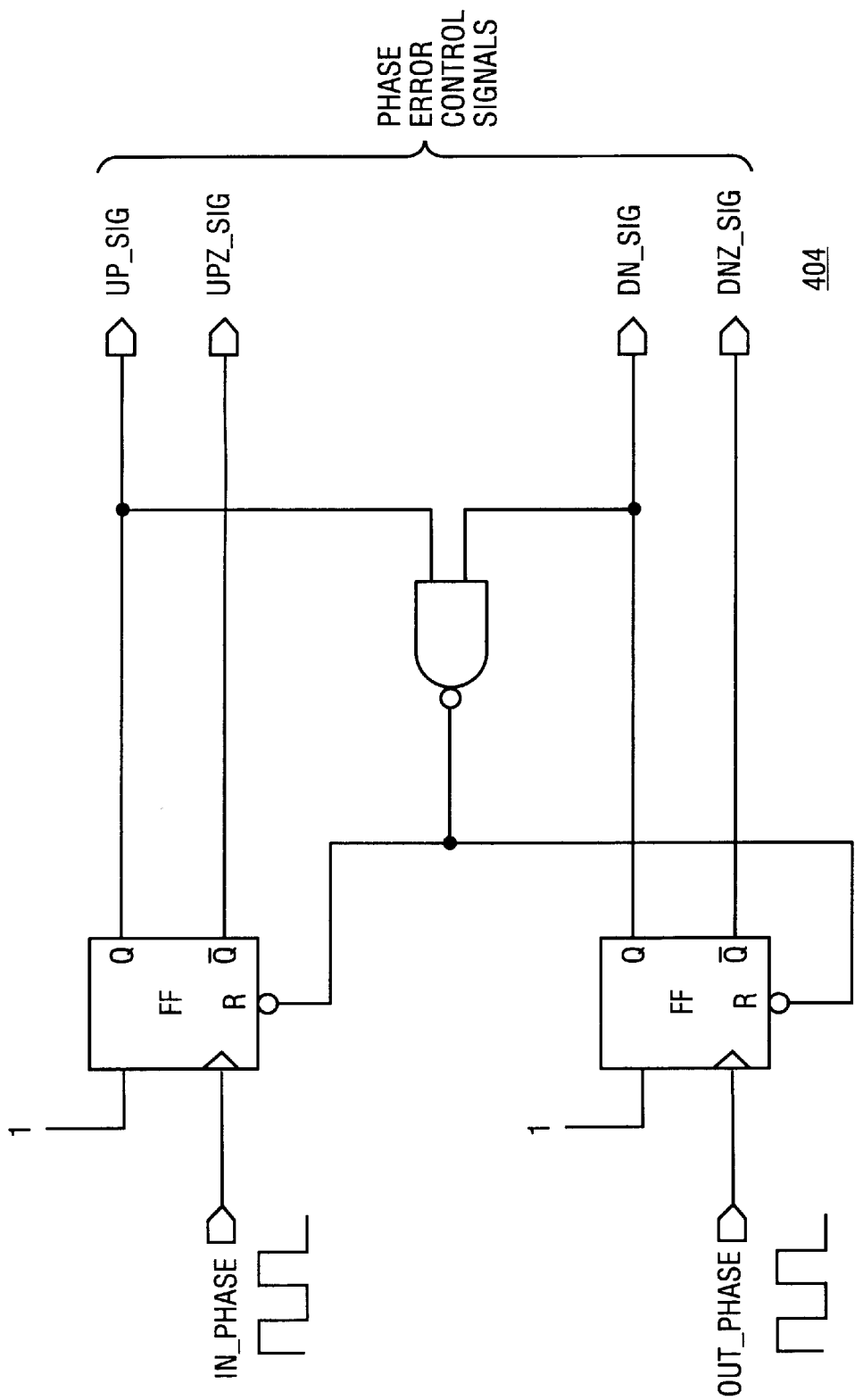
FIG. 5 shows a logic diagram of a conventional digital phase detector.

The different embodiments of the charge pump circuit 100 described above can be combined with a phase detector, such as the conventional PFD 404 illustrated in FIG. 5, a loop filter, and a VCO to form a frequency control circuit such as the PLL 400 of FIG. 4. The phase error control signals from the phase detector are used to control a switch circuit at each of the transfer nodes 112 . . . 118 in FIG. 1. The switch circuit and the phase error control signals can be configured so that the charge transfer node is always coupled to either a filter node or its corresponding bypass nodes, thus continuously maintaining current through the charge transfer nodes' respective current generator.

Figure 3:
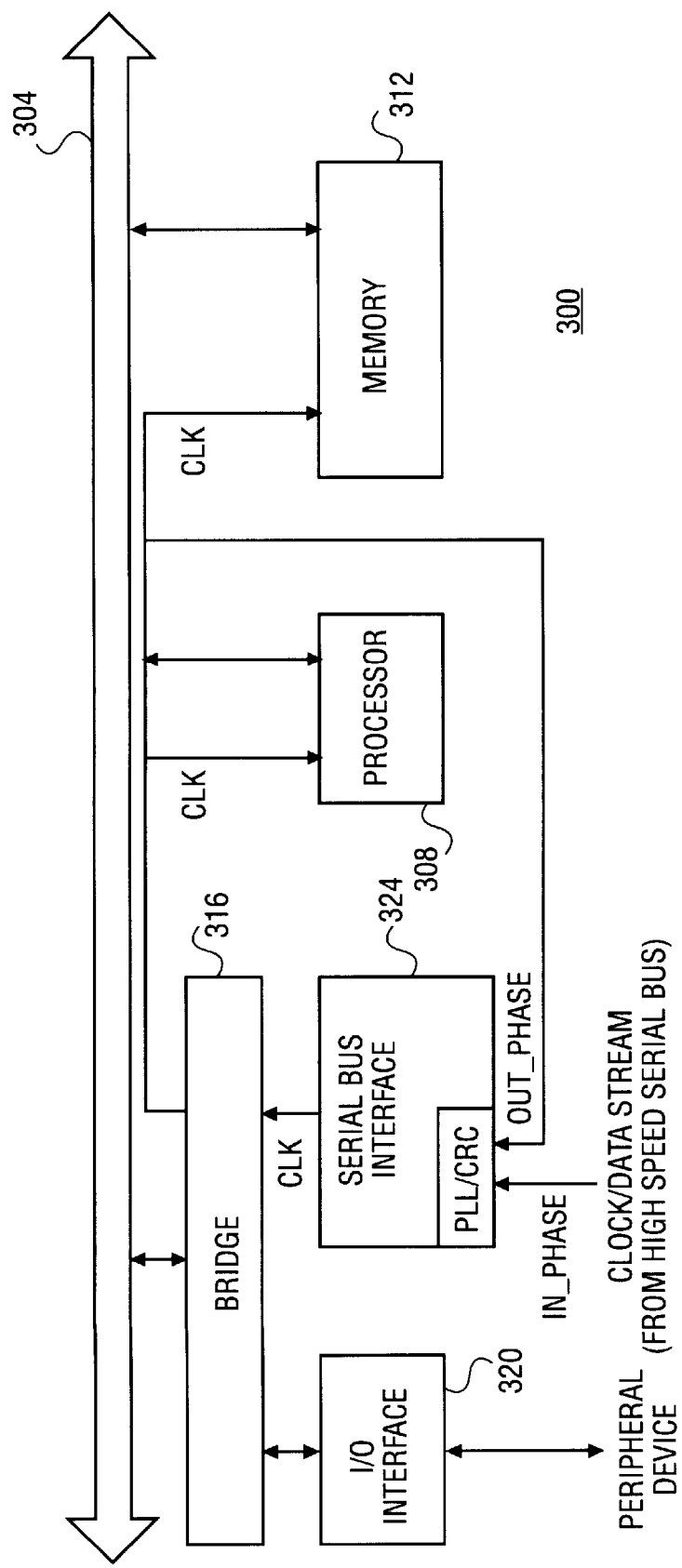
FIG. 3 illustrates an electronic system configured with a phase locked loop according to an embodiment of the invention.

The differential charge pump circuit 100 described above can be used in a number of different system applications, one of which is illustrated in FIG. 3. The electronic system 300 in FIG. 3 can be part of a motherboard in a personal computer (PC), or it may be the part of an embedded processor application. A system bus 304 can be accessed by a number of bus devices, including a processor 308, a memory 312, and a bridge 316. The bridge 316 allows one of a number of bus devices to access the system bus 304 according to a priority scheme. The bus devices include an I/O interface 320 and a serial bus interface 324. The serial bus interface 324 delivers data from a serial bus to the system bus 304. In addition, the serial bus interface 334 recovers a clock signal from signals received via the serial bus. This is done by a phase locked loop/clock recovery circuit ("PLL/CRC"), such as the one illustrated in FIG. 4, that is equipped with the differential charge pump circuit 100 of the various embodiments of the invention. The bus interface 324 accesses the system bus 304 via the bridge 316 to deliver the data and the clock to the system bus 304.

A clock or data stream provides the in_phase information to the PLL/CRC while the out_phase information may be derived from a location on the circuit board that is near the processor and the memory 312. The PLL/CRC in the serial bus interface 324 operates according to the feedback control circuit of FIG. 4 to provide a controlled clock signal ("CLK") that is fed to the bridge 316 and then distributed to other bus devices including the processor 308 and the memory 312. Use of the differential charge pump circuit 100 and its novel technique for controlling the common mode level of the differential output voltage will permit more accurate control of the skew in CLK. The more accurate control is particularly desirable in systems that operate at relatively high clock frequencies and in which excessive skew in clock signals is more likely to have a crippling effect.

To summarize, various embodiments of the invention have been described that feature an improved technique for controlling the common mode voltage of the output of a differential charge pump. The invention may use trimmable buffers between the filter and bypass nodes to buffer the differential voltage on the filter nodes as well as in directly change the common mode level of the filter nodes. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuit comprising:

first and second filter nodes;

first and second bypass nodes corresponding to the first and second filter nodes, respectively;

a charge transfer circuit having at least one charge transfer node to be alternately coupled through a low impedance path switching means to one of the filter nodes and a corresponding one of the bypass nodes; and first and second amplifiers to buffer the voltages on the first and second filter nodes and provide first and second output voltages to the first and second bypass nodes, respectively, wherein the output voltage of each amplifier is adjusted according to a difference between a control voltage and a common mode voltage of the first and second filter nodes.

2. The circuit of claim 1 wherein the charge transfer circuit includes an up current source and an up current sink, the up current source to alternatively feed the first filter node and the first bypass node, the up current sink to alternatively draw from the second filter node and the second bypass node, the up current source and the up current sink when coupled to the first and second filter nodes, respectively, cause the differential voltage of the filter nodes to increase.

3. The circuit of claim 2 wherein the charge transfer circuit further includes a down current sink and a down current source, the down current sink to draw from one of the first filter node and the first bypass node, the down current source to feed one of the second filter node and the second bypass node, the down current sink and the down current source when coupled to the first and second filter nodes, respectively, cause the differential voltage of the filter nodes to decrease.

4. The circuit of claim 1 further comprising:

third amplifier having a first input to receive the control voltage, a second input to receive the common mode voltage of the first and second nodes, and an output coupled to the first and second amplifiers to provide a voltage proportional to the difference between the control voltage and the common mode voltage.

5. The circuit of claim 4 wherein the output voltage of each of the first and second amplifiers can be adjusted by the same amount as the difference between the control voltage and the common mode voltage.

6. The circuit of claim 1 wherein the first and second amplifiers are configured to buffer the voltages on the first and second filter nodes with unity gain.

7. The circuit of claim 1 wherein the charge transfer circuit further comprises
a storage device coupled between the at least one charge transfer node and a power supply node to increase the amount of charge transferred to said one of the filter nodes in proportion to (1) a difference between the voltages on said one of the filter nodes and said corresponding one of the bypass nodes and (2) a parasitic capacitance of the at least one charge transfer node plus the added capacitance of the storage device.

8. The circuit of claim 2 wherein the up current source includes at least one MOSFET to conduct current from a power supply node to the at least one charge transfer node.

9. The circuit of claim 8 wherein the MOSFET is a p-channel device and the power supply node is at a positive voltage.

10. The circuit of claim 8 further comprising:
a loop filter coupled between the filter nodes; and a
voltage controlled oscillator having an input coupled to the filter nodes and an output to provide a controlled oscillatory signal.

11. The circuit of claim 1 further comprising:
a loop filter coupled between the filter nodes; and a
voltage controlled oscillator having an input coupled to the bypass nodes and an output to provide a controlled oscillatory signal.

12. A circuit comprising:
first and second filter nodes;
first and second bypass nodes corresponding to the first and second filter nodes, respectively;
a charge transfer circuit having at least one charge transfer node that is alternately coupled through a low impedance path to one of the filter nodes and a corresponding one of the bypass nodes; and
first trimmable buffer including a first amplifier having a load and a first output, the first output being coupled to the first bypass node, the first amplifier being configured to buffer the voltage on the first filter node at the first bypass node, and a differential amplifier sharing the load of the first amplifier to change the voltage at the first bypass node according to a difference between a control voltage and a common mode voltage of the differential voltage between the first and second filter nodes.

13. The circuit of claim 12 further comprising
second trimmable buffer coupled between the second filter node and the second bypass node to buffer the voltage on the second filter node and to change the voltage at the second bypass node according to the difference between the control voltage and the common mode voltage.

14. The circuit of claim 12 wherein the first amplifier is configured to buffer the voltage on the first filter with non-unity gain.

15. The circuit of claim 12 further comprising
common mode voltage circuit having MOSFET inputs coupled to the first and second filter nodes, respectively, and an output to generate the common mode voltage.

16. The circuit of claim 12 further comprising:
switch circuit that can alternatively couple through a low impedance path the at least one charge transfer node to said one of the filter nodes and said corresponding one of the bypass nodes; and
phase detector to generate complementary phase error signals at least one of which is to control the switch circuit.

17. The circuit of claim 16 further comprising a current generator coupled to the at least one charge transfer node, and wherein the switch circuit and the phase error signals are configured so that the at least one charge transfer node is to always be coupled to one of (1) said one of the filter nodes and (2) said corresponding one of the bypass nodes, to continuously maintain current through the current generator and the at least one charge transfer node.

18. The circuit of claim 12 further comprising:
a loop filter coupled between the filter nodes; and a
voltage controlled oscillator having an input coupled to the filter nodes and an output to provide a controlled oscillatory signal.

19. An electronic system comprising:
system bus;
processor and memory coupled to the bus; and
bus interface device capable of recovering a clock signal from signals received via a bus, and to deliver data from the bus to the system bus, the bus interface device includes a phase locked loop having a phase detector, charge pump and filter, and voltage controlled oscillator (VCO), the phase detector to generate phase error signals in response to comparing an input phase to an output phase, the charge pump and filter capable of generating a differential voltage proportional to the phase error signals, and the VCO to generate an oscillatory output signal whose frequency is proportional to the differential voltage, and wherein the charge pump includes first and second filter nodes, first and second bypass nodes corresponding to the first and second filter nodes, respectively, a charge transfer circuit having at least one charge transfer node that is capable of being alternately coupled through a low impedance path switching means to one of the filter nodes and a corresponding one of the bypass nodes, and first and second amplifiers to buffer the voltages on the first and second filter nodes and provide first and second output voltages to the first and second bypass nodes, respectively, wherein the output voltage of each amplifier is adjusted according to a difference between a control voltage and a common mode voltage of the first and second filter nodes, the first and second filter nodes being coupled to an input of the VCO.

20. The electronic system of claim 19 further comprising:
bridge to allow one of a plurality of bus devices to access the system bus according to a priority scheme, the bus interface device to access the system bus via the bridge to deliver the data and the clock to the system bus.

21. The electronic system of claim 19 wherein in the charge pump, the charge transfer circuit includes an up current source and an up current sink, the up current source to alternatively feed the first filter node and the first bypass node, the up current sink to alternatively draw from the second filter node and the second bypass node, the up current source and the up current sink when coupled to the first and second filter nodes, respectively, cause the differential voltage of the filter nodes to increase.

22. The electronic system of claim 21 wherein in the charge pump, the charge transfer circuit further includes a down current sink and a down current source, the down current sink to draw from one of the first filter node and the first bypass node, the down current source to feed one of the second filter node and the second bypass node, the down current sink and the down current source when coupled to the first and second filter nodes, respectively, cause the differential voltage of the filter nodes to decrease.

23. The electronic system of claim 19 wherein in the charge pump, the charge transfer circuit further comprises a storage device coupled between the at least one charge transfer node and a power supply node to increase the amount of charge transferred to said one of the filter nodes in proportion to (1) a difference between the voltages on said one of the filter nodes and said corresponding one of the bypass nodes and (2) a parasitic capacitance of the at least one charge transfer node plus the added capacitance of the storage device.

24. The electronic system of claim 21 wherein in the charge pump, the up current source includes at least one MOSFET to conduct current from a power supply node to the at least one charge transfer node.

25. The electronic system of claim 19 wherein the bus is a serial bus.

26. The circuit of claim 12 wherein the first and second filter nodes are coupled to a filter and support a differential voltage and the corresponding one of the bypass nodes transfers charge to control a differential voltage of the filter nodes.

* * * * *